United States Patent
Estes et al.

(10) Patent No.: US 6,971,162 B2
(45) Date of Patent: Dec. 6, 2005

(54) LOCALIZED ENHANCEMENT OF MULTILAYER SUBSTRATE THICKNESS FOR HIGH Q RF COMPONENTS

(75) Inventors: John C. Estes, Tempe, AZ (US); Rodolfo Lucero, Scottsdale, AZ (US); Anthony M. Pavio, Paradise Valley, AZ (US)

(73) Assignee: Motorola, Inc., Schaumburg, IL (US)

( * ) Notice: Subject to any disclaimer, the term of this patent is extended or adjusted under 35 U.S.C. 154(b) by 339 days.

(21) Appl. No.: 10/437,721

(22) Filed: May 13, 2003

(65) Prior Publication Data

US 2004/0228099 A1 Nov. 18, 2004

(51) Int. Cl.⁷ ............................................. H05K 3/30
(52) U.S. Cl. ............................. 29/832; 29/836; 29/841; 29/739; 29/740; 29/852; 174/255; 174/260; 361/761; 361/764
(58) Field of Search ........................... 29/832, 836, 841, 29/739, 740, 852; 174/255, 260; 361/761, 361/764

(56) References Cited

U.S. PATENT DOCUMENTS

| | | | |
|---|---|---|---|
| 3,971,127 A | * | 7/1976 | Giguere et al. ............... 29/827 |
| 6,487,083 B1 | * | 11/2002 | Kwong ......................... 361/761 |
| 6,621,910 B1 | * | 9/2003 | Weckstrom et al. ......... 381/351 |
| 6,732,428 B1 | * | 5/2004 | Kwong .......................... 29/832 |
| 6,889,084 B2 | * | 5/2005 | Thompson et al. ........... 607/36 |

* cited by examiner

Primary Examiner—Richard K. Chang

(57) ABSTRACT

An exemplary system and method for providing differential adjustment of the height of a multilayer substrate in localized areas for improved Q-factor performance of RF devices is disclosed as comprising inter alia: a multilayer substrate (200); an RF component (210) embedded in the substrate (200); a surface mounted component (220); and an RF shield (260) disposed next to the surface mounted component (220), wherein the height of the shield (260) does not extend substantially beyond the height of the surface mounted component (220). Disclosed features and specifications may be variously controlled, configured, adapted or otherwise optionally modified to further improve or otherwise optimize Q, RF performance and/or material characteristics. Exemplary embodiments of the present invention representatively provide for high-performance, high-quality RF devices that may be readily incorporated with existing technologies for the improvement of frequency response, device package form factors, weights and/or other manufacturing, device or material performance metrics.

8 Claims, 2 Drawing Sheets

*—PRIOR ART—*

LOCALIZED ENHANCEMENT OF MULTILAYER SUBSTRATE THICKNESS FOR HIGH Q RF COMPONENTS

FIELD OF INVENTION

The present invention generally concerns multilayer RF devices; and more particularly, in various representative and exemplary embodiments, to systems and methods for enhancing the quality of high performance RF filters by modifying the height of a multilayer substrate in localized areas.

BACKGROUND

As cellular technology transitions from 2G to 3G, size reduction and integration of components becomes more important with increasing device functionality. For example, many mobile phones are already incorporating GSM/PCS/DCS and WCDMA functionality. Low temperature co-fired ceramics (LTCC) has proven to be a useful integration technology wherein RF passive components may be embedded while active devices are conventionally surface mounted on the substrate. Due to the shrinking form factor of wireless devices, height restrictions generally impose an upper limit on the thickness of, for example, an LTCC substrate in addition to the height of surface mount components. For some RF components, such as LTCC filters, the performance (i.e., loss or rejection) may be dependent on the height. In general, the height improves the quality factor (Q) of embedded resonators, which in turn results in lower passband loss and/or greater out of band rejection.

In a conventional example, a filter may require 1.6 mm of height in order to meet specified performance goals. If the maximum module height is 1.6 mm, then either the entire LTCC substrate would be required to be 1.6 mm (which generally precludes the use of SMT components) or the LTCC substrate would need to be 1.0 mm (assuming 0.5 mm high SMT components and a lid), which generally precludes designing a filter that will meet specifications. Accordingly, a method would be desirable wherein the thickness of the ceramic substrate may be greater in an area where the filters are integrated and thinner in areas where SMT components are to be placed and/or lower Q-factor RF components may be embedded.

SUMMARY OF THE INVENTION

In various representative aspects, the present invention provides a system and method for enhancing the Q-factor of high performance RF filters. An exemplary system and method for providing such a device is disclosed as comprising inter alia: a multilayer substrate; an RF component embedded in the substrate; a surface mounted component; and an RF shield cover disposed next to the surface mounted component, wherein the height of the shield cover does not extend substantially beyond the height of the surface mounted component, but nevertheless differentially increases the RF volume in regions unoccupied by or otherwise geminal to other surface mounted components. Fabrication is relatively simple and straightforward. Additional advantages of the present invention will be set forth in the Detailed Description which follows and may be obvious from the Detailed Description or may be learned by practice of exemplary embodiments of the invention. Still other advantages of the invention may be realized by means of any of the instrumentalities, methods or combinations particularly pointed out in the claims.

BRIEF DESCRIPTION OF THE DRAWING

Representative elements, operational features, applications and/or advantages of the present invention reside inter alia in the details of construction and operation as more fully hereafter depicted, described and claimed—reference being made to the accompanying drawings forming a part hereof, wherein like numerals refer to like parts throughout. Other elements, operational features, applications and/or advantages will become apparent to skilled artisans in light of certain exemplary embodiments recited in the Detailed Description, wherein:

Those skilled in the art will appreciate that elements in the Figures are illustrated for simplicity and clarity and have not necessarily been drawn to scale. For example, the dimensions of some of the elements in the Figures may be exaggerated relative to other elements to help improve understanding of various embodiments of the present invention. Furthermore, the terms 'first', 'second', and the like herein, if any, are used inter alia for distinguishing between similar elements and not necessarily for describing a sequential or chronological order. Moreover, the terms front, back, top, bottom, over, under, and the like in the Description and/or in the claims, if any, are generally employed for descriptive purposes and not necessarily for comprehensively describing exclusive relative position. Skilled artisans will therefore understand that any of the preceding terms so used may be interchanged under appropriate circumstances such that various embodiments of the invention described herein, for example, are capable of operation in other orientations than those explicitly illustrated or otherwise described.

DETAILED DESCRIPTION OF EXEMPLARY EMBODIMENTS

The following descriptions are of exemplary embodiments of the invention and the inventors' conceptions of the best mode and are not intended to limit the scope, applicability or configuration of the invention in any way. Rather, the following Description is intended to provide convenient illustrations for implementing various embodiments of the invention. As will become apparent, changes may be made in the function and/or arrangement of any of the elements described in the disclosed exemplary embodiments without departing from the spirit and scope of the invention.

A detailed description of an exemplary application, namely a system and method for differentially increasing the effective RF shielding volume in regions unoccupied by or otherwise geminal to other surface mounted active components is provided as a specific enabling disclosure that may be readily generalized by skilled artisans to any application of the disclosed system and method for multilayer RF device shielding in accordance with various embodiments of the present invention.

Figure 1:
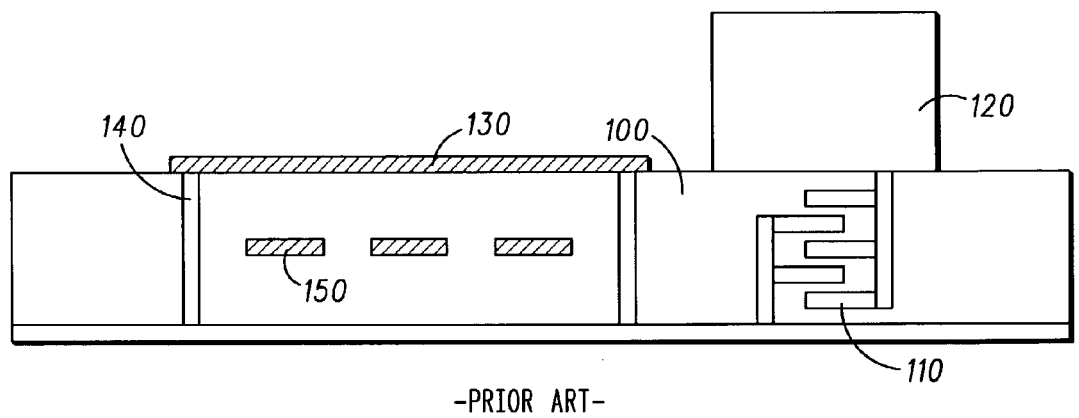
FIG. 1 representatively illustrates a cross-sectional view of a ceramic multilayer RF device in accordance with the prior art.

FIG. 1 generally illustrates a conventional approach for EM shielding in accordance with the prior art. A substrate 100 having an embedded RF element 110 is configured with a stripline resonator component 150 integrated into the substrate 100 in a region laterally disposed to a surface mounted active component 120. The substrate 100 is typically outfitted with vias 140 to connect a ground plane 130 over the exposed surface of the substrate 100 above the resonator element 150 so as to shield the resonator 150 from external RF interference. In this conventional example, the effective RF shielding volume defined by the boundaries of the backside substrate 100 surface, the vias 140 and the ground plane 130 are essentially limited by the density of laterally disposed surface mounted components 120 and the thickness of the substrate 100 itself.

Figure 2:
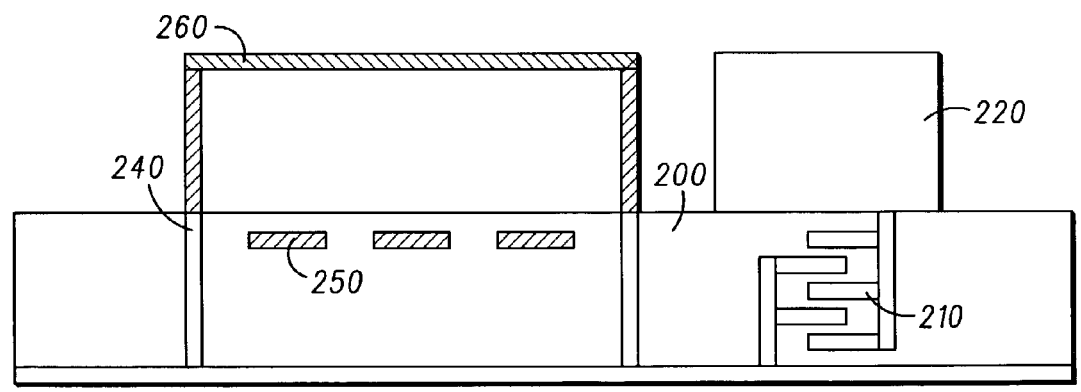
FIG. 2 representatively depicts a cross-sectional view of a multilayer RF device in accordance with an exemplary embodiment of the present invention.

In accordance with various representative aspects of exemplary embodiments of the present invention, a method of differentially increasing the substrate height or RF volume in discrete localized areas of the module substrate, in order inter alia to integrate various RF components that require high Q performance factors, is disclosed. For example, FIG. 2 representatively illustrates a system and method wherein the substrate 200 has an embedded RF element 210 and also has a resonator component 250 integrated into the substrate 200 in a region laterally disposed to a surface mounted active component 220. The substrate 200 is outfitted with vias 240, in this embodiment, to connect with a shielding component 260 over the exposed surface of the substrate 200 above the resonator element 250 so as to shield the resonator 250 from external RF interference. The sides of the shield 260 connect to ground vias 240 which connect the top of the shield 260 along with the bottom ground plane thereby defining the RF volume. In accordance with this exemplary embodiment of the present invention, the effective RF shielding volume is now generally defined by the boundaries of the backside substrate 200 surface, the vias 240 and the extended shield component 260 which, for example, encloses a void volume defined by the raised height of the shield component 260 above the otherwise exposed surface of the substrate 200. Accordingly, the effective RF shielding volume is no longer limited by the thickness of the substrate 200. In various exemplary embodiments, the void volume may comprise a vacuum, air, ceramic material, dielectric material, ferrite and/or any other material now known or hereafter otherwise described in the art. Additionally, the shielded RF component 210 and/or the resonator element 250 may alternatively, conjunctively or sequentially comprise, for example, any of: a capacitor; a tunable capacitor; a phase-shifter; an EM reflection lens; a varactor; an oscillator; a voltage control oscillator; a filter; a tunable filter; a frequency mixer; a frequency multiplier; a phase-array antenna; a resonator; a stripline resonator and/or any other electronic component whether now known or otherwise hereafter described in the art.

Figure 3:
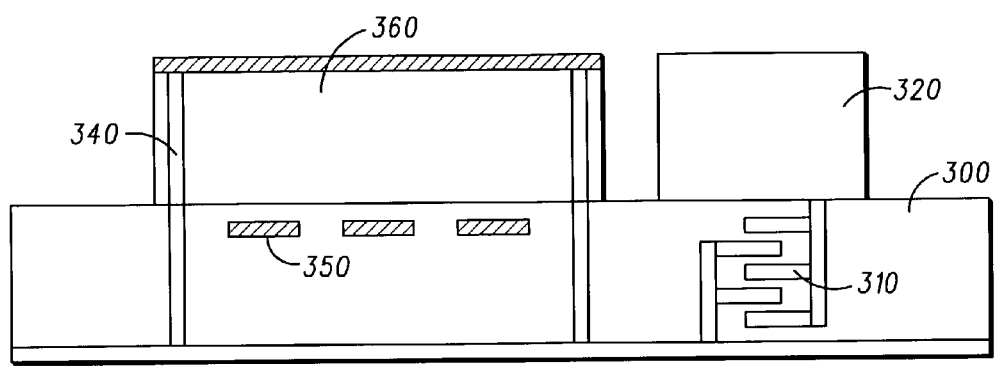
FIG. 3 representatively depicts a cross-sectional view of a multilayer RF device in accordance with another exemplary embodiment of the present invention.
Figure 4:
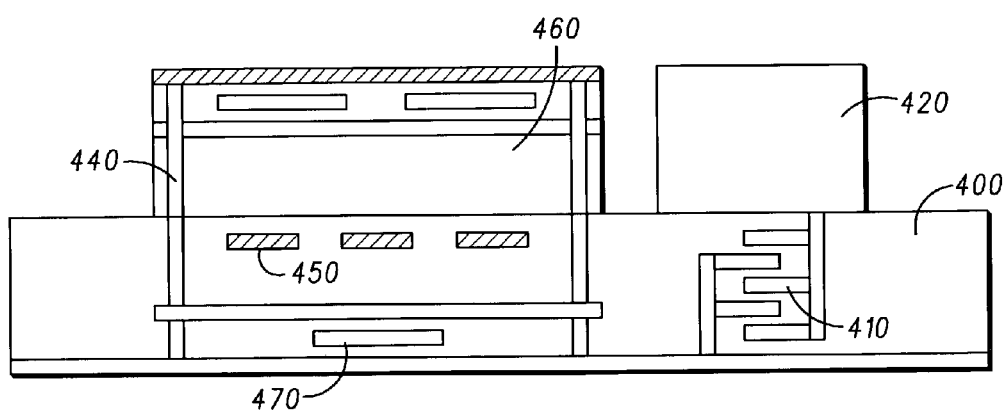
FIG. 4 representatively depicts a cross-sectional view of a multilayer RF device in accordance with yet another exemplary embodiment of the present invention.

In an alternate exemplary embodiment, as generally depicted for example in FIG. 3, a substrate 300 again has an embedded RF element 310 as well as a resonator component 350 integrated into the substrate 300 in a region laterally disposed to a surface mounted active component 320. The substrate 300 is configured with vias 340, in this particular embodiment, to connect with an LTCC shield component 360 over the exposed surface of the substrate 300 above the resonator element 350 so as to shield the resonator 350. The sides of the LTCC shield 360 connect to ground vias 340 which connect the top of the LTCC shield 360 along with the bottom ground plane thereby defining the RF volume. In accordance with this exemplary embodiment of the present invention, again the effective RF shielding volume is no longer limited by the thickness of the substrate 300 and/or density of laterally disposed surface mounted active components 320. Additionally, as generally depicted for example in FIG. 4, the LTCC shield component 460 and/or substrate 400 may further comprise other integrated electronic components 470 above, below or even within the provided RF shielding volume.

In general, on exemplary advantage of using an LTCC shield module 360, 460 would be that the shield generally would not be easily deformed during manufacture and processing; however, other materials known to skilled artisans may be alternatively, conjunctively or sequentially employed to produce substantially the same result and the same shall be regarded as within the scope of the present invention.

Computer simulation of increasing the filter RF volume height from 1.0 mm to 2.0 mm demonstrated substantial improvement in the passband insertion loss without changing the resonator line widths. In applications where the substrate height may be doubled, the resonator line widths, for example, may also be double in order inter alia to maintain substantially similar distributed capacitance. Accordingly, by differentially enhancing the height of a multilayer substrate regions in localized areas, the Q of RF components may be increased thereby enabling the integration of, for example, RF filters.

In the foregoing specification, the invention has been described with reference to specific exemplary embodiments; however, it will be appreciated that various modifications and changes may be made without departing from the scope of the present invention as set forth in the claims below. The specification and figures are to be regarded in an illustrative manner, rather than a restrictive one and all such modifications are intended to be included within the scope of the present invention. Accordingly, the scope of the invention should be determined by the claims appended hereto and their legal equivalents rather than by merely the examples described above. For example, the steps recited in any method or process claims may be executed in any order and are not limited to the specific order presented in the claims. Additionally, the components and/or elements recited in any apparatus claims may be assembled or otherwise operationally configured in a variety of permutations to produce substantially the same result as the present invention and are accordingly not limited to the specific configuration recited in the claims.

Benefits, other advantages and solutions to problems have been described above with regard to particular embodiments; however, any benefit, advantage, solution to problems or any element that may cause any particular benefit, advantage or solution to occur or to become more pronounced are not to be construed as critical, required or essential features or components of any or all the claims.

As used herein, the terms "comprises", "comprising", or any variation thereof, are intended to reference a non-exclusive inclusion, such that a process, method, article, composition or apparatus that comprises a list of elements does not include only those elements recited, but may also include other elements not expressly listed or inherent to such process, method, article, composition or apparatus. Other combinations and/or modifications of the above-described structures, arrangements, applications, proportions, elements, materials or components used in the practice of the present invention, in addition to those not specifically recited, may be varied or otherwise particularly adapted by those skilled in the art to specific environments, manufacturing specifications, design parameters or other operating requirements without departing from the general principles of the same.

We claim:

1. A method for improving the Q-factor of a multilayer embedded RF component, said method comprising the steps of:

providing a multilayer substrate;

providing an RF component, said RF component at least partially embedded in said substrate;

providing a first plurality of regions on at least a first surface of said substrate, said first regions substantially defined by the presence of surface mounted components thereon;

providing a second plurality of regions on at least a second surface of said substrate, said second regions substantially defined by the absence of surface mounted components thereon;

providing a shield component, said shield component disposed over at least one of said second regions, wherein the height of said shield component mounted to the substrate does not substantially extend effectively beyond the height of a tallest surface mounted component disposed on said first region;

said shield component further comprising a top surface and first sidewall vias;

said substrate under said second region comprising a bottom surface and second sidewall vias;

said first vias and said second vias suitably adapted to connect said top surface with said bottom surface in order to effectively define a substantially enclosed RF volume;

said RF volume having a electronic component shielded therein.

2. The method of claim 1, wherein said first surface and said second surface comprise the same surface.

3. The method of claim 1, wherein said top surface and said first sidewall vias substantially define a void volume, said void volume comprising at least one of air, a dielectric and ferrite.

4. The method of claim 1, wherein said shield component comprises at least one of a monolithic module, a ceramic module, and an LTCC module.

5. The method of claim 4, wherein said shield component further comprises at least one of an imbedded electronic component and an integrated electronic component.

6. The method of claim 1, wherein said vias comprise a plurality of substantially at least one of orthogonal and planar walls.

7. The method of claim 1, wherein said vias comprise a substantially curvilinear surface.

8. The method of claim 1, wherein said shield component further comprises an opening to permit tuning of an electronic component enclosed therein.

* * * * *